(12) United States Patent
Fekih-Romdhane et al.

(10) Patent No.: US 7,123,542 B2
(45) Date of Patent: Oct. 17, 2006

(54) MEMORY HAVING INTERNAL COLUMN COUNTER FOR COMPRESSION TEST MODE

(75) Inventors: Khaled Fekih-Romdhane, Houston, TX (US); Johann Pfeiffer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/022,202

(22) Filed: Dec. 22, 2004

(65) Prior Publication Data

US 2006/0133187 A1 Jun. 22, 2006

(51) Int. Cl.
*G11C 8/00* (2006.01)

(52) U.S. Cl. ............. 365/236; 365/189.04; 365/189.05

(58) Field of Classification Search ................. 365/263
See application file for complete search history.

(56) References Cited

U.S. PATENT DOCUMENTS

| | | | |
|---|---|---|---|
| 6,044,032 A * | 3/2000 | Li ........................... | 365/230.03 |
| 6,072,737 A | 6/2000 | Morgan et al. | |
| 6,118,729 A | 9/2000 | Hirabayashi et al. | |
| 6,166,967 A | 12/2000 | Do | |
| 6,307,410 B1 * | 10/2001 | Matsui ........................ | 327/154 |
| 6,311,299 B1 | 10/2001 | Bunker | |
| 6,484,289 B1 | 11/2002 | Hsu | |
| 6,542,433 B1 | 4/2003 | Ka | |
| 6,563,759 B1 * | 5/2003 | Yahata et al. ............... | 365/233 |
| 6,584,025 B1 | 6/2003 | Roohparvar et al. | |
| 6,693,841 B1 | 2/2004 | Roohparvar et al. | |
| 6,751,762 B1 | 6/2004 | Antonischki | |
| 2001/0007776 A1 | 7/2001 | Yagishita | |

OTHER PUBLICATIONS

A copy of PCT International Search Report for International Application No. PCT/EP2005/013934 mailed on May 22, 2006 (6 pages).

* cited by examiner

*Primary Examiner*—Thong Q. Le
(74) *Attorney, Agent, or Firm*—Dicke, Billig & Czaja, PLLC

(57) ABSTRACT

A memory circuit comprises a memory and an internal column counter for a read sequence in a compression test mode of the memory. The memory comprises an array of memory cells. The internal column counter is configured to provide a first column address for generating a compression register of expected data to compare to data read from the array of memory cells in response to a first read command, latch a second column address in response to a second read command while the first read command is executing, and provide the second column address for generating the compression register of expected data to compare to data read from the array of memory cells in response to the second read command once execution of the first read command is completed.

32 Claims, 3 Drawing Sheets

MEMORY HAVING INTERNAL COLUMN COUNTER FOR COMPRESSION TEST MODE

BACKGROUND

Dynamic random access memory (DRAM) chips are tested to verify the functionality of every memory cell within the DRAM chip. During the test, expected values are written to the memory cells of the DRAM chip and then the memory cells are read. If the data read from a memory cell matches the previously written data, the memory cell functionality is confirmed. If the data read from a memory cell does not match the previously written data, the memory cell fails. The failing memory cells are located and replaced with redundant memory cells.

One mode used to test DRAM chips is a compression test mode. The compression test mode is used to save test time and output pad connections for the test. During the compression test mode, the data read from the memory cells is not read at the output pads of the DRAM chip as in the normal read operation. Instead, the data that is read from the memory cells is compared to a read compression register and the result is compressed and passed to selected output pads. The bits on the selected output pads indicate which memory cells of the memory array are failing in the DRAM chip.

During the compression test mode, the data written to the memory array during the test is stored in a previously defined register. To write a certain pattern to the memory array, the design for test (DFT) design has to compensate for the topology of the memory array. Therefore, the register used to overwrite a memory cell has to be adapted depending on where the memory cell is located (e.g., to write solid physical ones to the memory array). The memory cell location is defined by the column address and row address associated with the memory cell.

On a DRAM chip, the topology of the memory array changes depending on the row as well as the column location. Therefore, the write and read compression register has to be changed according to the row address and column address of the memory cells being written. Typically, the write and read compression register is changed during the write and read bursts. A DRAM internal burst counter typically increments the column address during a read or write burst. During a write burst, the column address out of the internal burst counter is valid at each column access.

During a read burst on a DRAM, more than one column line is accessed in a sequential manner. Typically, the accessed columns are counted synchronously to the external clock through the burst counter. During the read burst, the data comes from the memory array and arrives at the data path after a delay. The data is then compared to the column address dependent write compression register. With an increase in the frequency requirement, the column address delivered by the internal burst counter is no longer valid at the time the data is valid at the data path. The column address may no longer be valid because the delay from the time the memory array is accessed to the time the data from the memory array is valid may be long enough to allow the burst counter to start counting the next column address associated with the next read burst.

SUMMARY

One embodiment of the present invention provides a memory circuit. The memory circuit comprises a memory and an internal column counter for a read sequence in a compression test mode of the memory. The memory comprises an array of memory cells. The internal column counter is configured to provide a first column address for generating a compression register of expected data to compare to data read from the array of memory cells in response to a first read command, latch a second column address in response to a second read command while the first read command is executing, and provide the second column address for generating the compression register of expected data to compare to data read from the array of memory cells in response to the second read command once execution of the first read command is completed.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
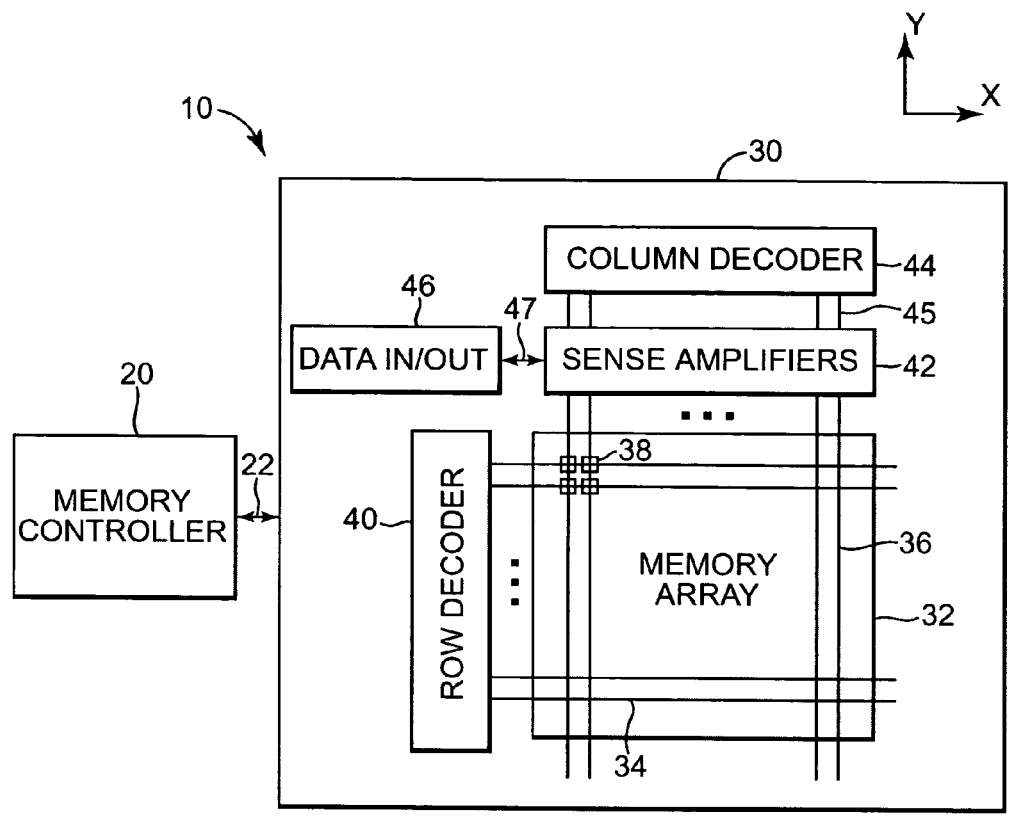
FIG. 1 is a block diagram illustrating one embodiment of a random access memory, according to the present invention.

FIG. 1 is a block diagram illustrating one embodiment of a memory 10. In one embodiment, memory 10 is a random access memory (RAM), such as a dynamic random access memory (DRAM), synchronous dynamic random access memory (SDRAM), double data rate synchronous dynamic random access memory (DDR SDRAM), or double data rate II synchronous dynamic random access memory (DDR-II SDRAM). Memory 10 includes a memory controller 20 and at least one memory bank 30. Memory bank 30 includes an array of memory cells 32, a row decoder 40, a column decoder 44, sense amplifiers 42, and data in/out circuit 46. Memory controller 20 is electrically coupled to memory bank 30 through communication link 22.

Memory 10 includes a normal operating mode and a compression test mode. Memory 10 is configured to test the array of memory cells 32 in the compression test mode. With the compression test mode selected, memory 10 writes expected data from a compression register to memory cells 38 of the array of memory cells 32. With the expected data written to the memory cells 38, memory 10 reads the data stored in the memory cells 38. Memory 10 compares the data read from the memory cells 38 to the expected data from the compression register. If the data read from a memory cell 38 matches the expected data for the memory cell 38, then a memory cell pass/fail signal indicating the memory cell 38 passed the test is provided. If the data read from a memory cell 38 does not match the expected data for the memory cell 38, then a memory cell pass/fail signal indicating the memory cell 38 failed the test is provided.

In one embodiment, column decoder 44 includes an internal column counter for read sequences in the compression test mode. To use the compression test mode for the burst lengths available for memory 10, the column address is incremented based on when the data from the array of memory cells 32 is valid. An active data valid signal is used to indicate the data read from the array of memory cells 32 is at the data path and valid. An inactive data valid signal is used to indicate the data read from the array of memory cells 32 is not at the data path. The comparison of the data read from the array of memory cells 32 to the compression register takes place in the data path. Until the data read from the array of memory cells 32 is at the data path and valid, the comparing sequence cannot start. In one embodiment, the data valid signal does not have a constant delay compared to the system clock for memory 10. The data valid signal fluctuates based on the process parameters during manufacturing of memory 10.

In one embodiment, the internal column counter is triggered by the falling edge of the data valid signal. Triggering the internal column counter with the falling edge of the data valid signal provides the correct column address for the compression register for the next data valid cycle. The compression register is kept stable while the data read from the array of memory cells 32 is valid. At the beginning of each read burst, the column address is latched in response to a read command signal. The internal column counter does not allow the column address for the compression register to be changed unless the previous read burst is completed. This prevents the compression register from being corrupted for an ongoing read burst in a read followed by a read situation (i.e., a back-to-back read).

Once the previous read burst is completed, the column counter is reset and the updating of the column address for the compression register is enabled. During the read burst, the data valid signal will toggle and the column address will be incremented. In one embodiment, the fluctuations of the data valid signal in reference to the system clock do not effect the correctness of the compression sequence because both the data read from the array of memory cells 32 and the read compression register are synchronized to the data valid signal.

Conductive word lines 34, referred to as row select lines, extend in the x-direction across the array of memory cells 32. Conductive bit lines 36, referred to as column select lines, extend in the y-direction across the array of memory cells 32. A memory cell 38 is located at each cross point of a word line 34 and a bit line 36. Each word line 34 is electrically coupled to row decoder 40, and each bit line 36 is electrically coupled to a sense amplifier 42. The sense amplifiers 42 are electrically coupled to column decoder 44 through conductive column decoder lines 45 and to data in/out circuit 46 through data lines 47.

Data in/out circuit 46 includes a plurality of latches and data input/output (I/O) pads or pins (DQs) to transfer data between memory bank 30 and an external device. In the normal operating mode, data to be written into memory bank 30 is presented as voltages on the DQs from an external device. The voltages are translated into the appropriate signals and stored in selected memory cells 38. Data read from memory bank 30 is presented by memory bank 30 on the DQs for an external device to retrieve. Data read from selected memory cells 38 appears at the DQs once access is complete and the output is enabled. At other times, the DQs are in a high impedance state.

Memory controller 20 controls reading data from and writing data to memory bank 30. During a read operation in the normal operating mode, memory controller 20 passes the row address of a selected memory cell or cells 38 to row decoder 40. Row decoder 40 activates the selected word line 34. As the selected word line 34 is activated, the value stored in each memory cell 38 coupled to the selected word line 34 is passed to the respective bit line 36. The value of each memory cell 38 is read by a sense amplifier 42 electrically coupled to the respective bit line 36. Memory controller 20 passes a column address of the selected memory cell or cells 38 to column decoder 44. Column decoder 44 selects which sense amplifiers 42 pass data to data in/out circuit 46 for retrieval by an external device.

During a write operation in the normal operating mode, the data to be stored in the array of memory cells 32 is placed in data in/out circuit 46 by an external device. Memory controller 20 passes the row address for the selected memory cell or cells 38 where the data is to be stored to row decoder 40. Row decoder 40 activates the selected word line 34. Memory controller 20 passes the column address for the selected memory cell or cells 38 where the data is to be stored to column decoder 44. Column decoder 44 selects which sense amplifiers 42 are passed the data from data in/out circuit 46. Sense amplifiers 42 write the data to the selected memory cell or cells 38 through bit lines 36.

Figure 2:
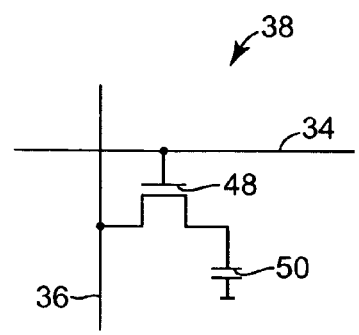
FIG. 2 is a diagram illustrating one embodiment of a memory cell.

FIG. 2 is a diagram illustrating one embodiment of one memory cell 38 in the array of memory cells 32. Memory cell 38 includes a transistor 48 and a capacitor 50. The gate of transistor 48 is electrically coupled to word line 34. The drain-source path of transistor 48 is electrically coupled to bit line 36 and capacitor 50. Capacitor 50 is charged to represent either a logic '0' or a logic '1.' During a read operation, word line 34 is activated to turn on transistor 48 and the value stored on capacitor 50 is read by a corresponding sense amplifier 42 through bit line 36 and transistor 48. During a write operation, word line 34 is activated to turn on transistor 48 and the value stored on capacitor 50 is written by a corresponding sense amplifier 42 through bit line 36 and transistor 48.

The read operation on memory cell 38 is a destructive read operation. After each read operation, capacitor 50 is recharged with the value that was just read. In addition, even without read operations, the charge on capacitor 50 discharges over time. To retain a stored value, memory cell 38 is refreshed periodically by reading or writing the memory cell 38. All memory cells 38 within the array of memory cells 32 are periodically refreshed to maintain their values.

In one embodiment, memory 10 is a double data rate synchronous dynamic random access memory (DDR SDRAM). In DDR SDRAM, the read and write operations are synchronized to a system clock. The system clock is supplied by a host system that includes the DDR SDRAM. DDR SDRAM operates from a differential clock, CK and bCK. The crossing of CK going high and bCK going low is referred to as the positive edge of CK. Commands such as read and write operations, including address and control signals, are registered at the positive edge of CK. Operations are performed on both the rising and falling edges of the system clock.

The DDR SDRAM uses a double data rate architecture to achieve high speed operation. The double data rate architecture is essentially a 2n prefetch architecture with an interface designed to transfer two data words per clock cycle at the DQs. A single read or write access for the DDR SDRAM effectively consists of a single 2n bit wide, one clock cycle data transfer at the internal memory array and two corresponding n bit wide, one half clock cycle data transfers at the DQs.

Read and write accesses to the DDR SDRAM are burst oriented. Accesses start at a selected location and continue for a programmed number of locations in a programmed sequence. Accesses begin with the registration of an active command, which is followed by a read or write command. The address bits registered coincident with the active command are used to select the bank and row to be accessed. The address bits registered coincident with the read or write command are used to select the bank and the starting column location for the burst access.

The DDR SDRAM in the preceding description is referred to as DDR-I SDRAM for being the first generation of DDR SDRAM. The next generation of DDR SDRAM, DDR-II SDRAM has the same features as DDR-I SDRAM except that the data rate is doubled. The DDR-II SDRAM architecture is essentially a 4n prefetch architecture with an interface designed to transfer four data words per clock cycle at the DQs. A single read or write access for the DDR-II SDRAM effectively consists of a single 4n bit wide, one clock cycle data transfer at the internal memory array and four corresponding n bit wide, one quarter clock cycle data transfers at the DQs. In one embodiment, memory 10 is a DDR-II SDRAM.

Figure 3:
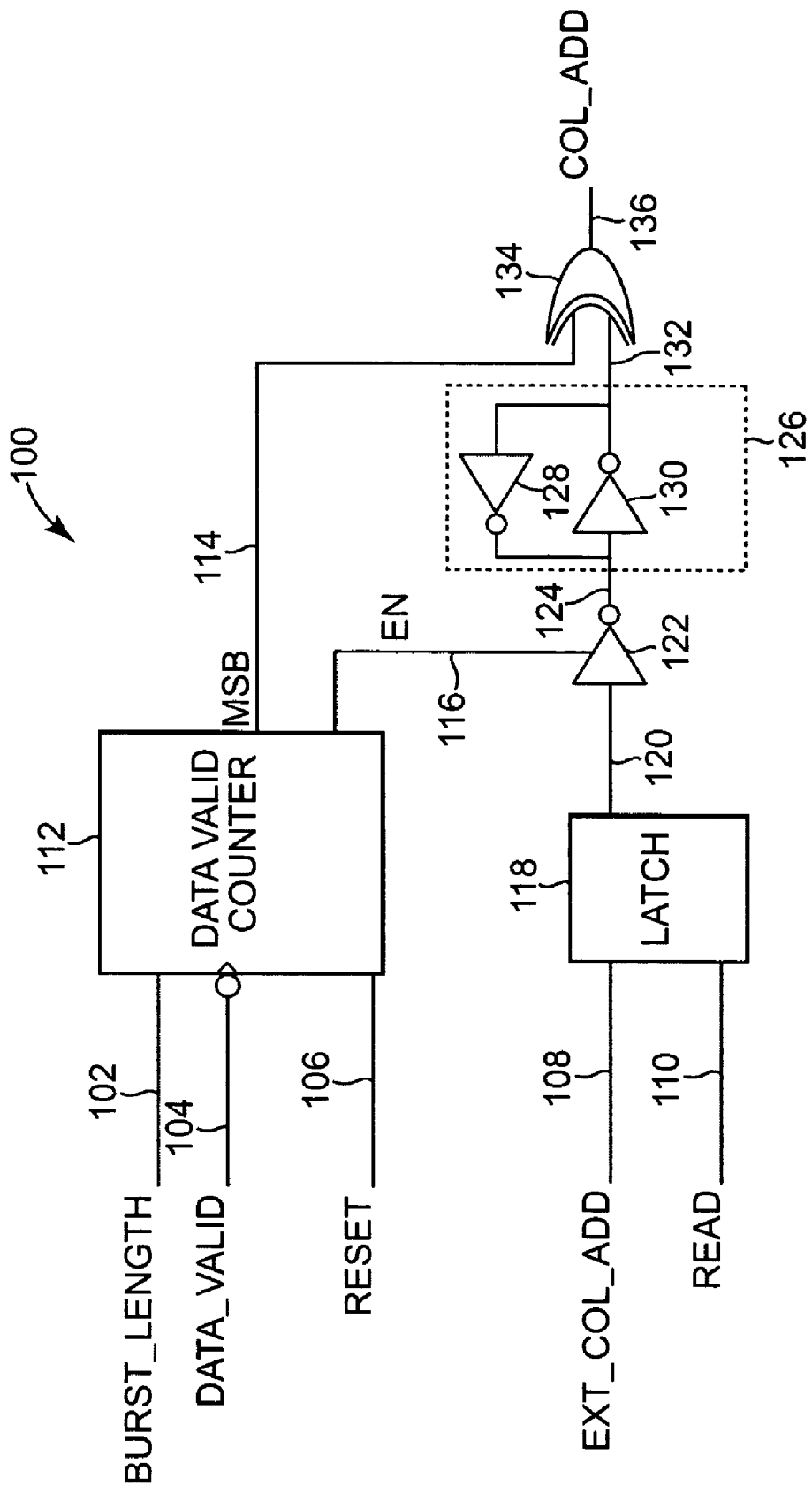
FIG. 3 is a diagram illustrating one embodiment of an internal column counter for a read sequence in a compression test mode.

FIG. 3 is a diagram illustrating one embodiment of an internal column counter 100 for a read sequence in the compression test mode. Internal column counter 100 includes a data valid counter 112, latches 118 and 126, inverting tri-state buffer 122, and exclusive OR (XOR) gate 134. In one embodiment, latch 126 includes inverters 128 and 130.

Data valid counter 112 receives the burst length (BURST_LENGTH) signal on BURST_LENGTH signal path 102, the data valid (DATA_VALID) signal on DATA_VALID signal path 104, and the reset (RESET) signal on RESET signal path 106. Data valid counter 112 is electrically coupled to a first input of XOR gate 134 through most significant bit (MSB) signal path 114. Data valid counter 112 is electrically coupled to the enable input of inverting tri-state buffer 122 through enable (EN) signal path 116. Latch 118 receives the external column address (EXT_COL_ADD) signal on EXT_COL_ADD signal path 108 and the read (READ) signal on READ signal path 110. Latch 118 is electrically coupled to the input of inverting tri-state buffer 122 through signal path 120. The output of inverting tri-state buffer 122 is electrically coupled to the input of inverter 130 and the output of inverter 128 through signal path 124. The output of inverter 130 is electrically coupled to the input of inverter 128 and the second input of XOR gate 134 through signal path 132. XOR gate 134 provides the column address (COL_ADD) signal on COL_ADD signal path 136.

The count of data valid counter 112 is reset to zero in response to the RESET signal on RESET signal path 106. In response to a count equal to zero, data valid counter 112 outputs a logic high EN signal on EN signal path 116. In one embodiment, the count of data valid counter 112 is incremented in response to the falling edge of the DATA_VALID signal on DATA_VALID signal path 104. The most significant bit of the current count of data valid counter 112 is output on MSB signal path 114. In one embodiment, the two to four most significant bits of the current count of data valid counter 112 are output by data valid counter 112. The number of most significant bits output is based on the highest burst length of memory 10. In one embodiment, data valid counter 112 counts from zero up to the burst length divided by four (four being the minimum burst length). Once the count of data valid counter 112 equals the burst length divided by four, the count of data valid counter 112 is reset to zero.

Latch 118 receives the EXT_COL_ADD signal on EXT_COL_ADD signal path 108 and the READ signal on READ signal path 110, and provides the latched EXT_COL_ADD signal on signal path 120. In response to a logic high READ signal, latch 118 latches the EXT_COL_ADD signal. In response to a logic low READ signal, latch 118 maintains the latch of the EXT_COL_ADD signal and provides the latched EXT_COL_ADD signal on signal path 120.

Inverting tri-state buffer 122 receives the latched EXT_COL_ADD signal from latch 118 on signal path 120, and inverts and provides the latched EXT_COL_ADD signal to latch 126 through signal path 124. In response to a logic high EN signal on EN signal path 116, inverting tri-state buffer 122 inverts and passes the latched EXT_COL_ADD signal on signal path 120 to signal path 124. In response to a logic low EN signal on EN signal path 116, inverting tri-state buffer 122 blocks the latched EXT_COL_ADD signal from passing to signal path 124. Latch 126 inverts and latches the signal on signal path 124 to provide a signal on signal path 132.

XOR gate 134 receives the MSB signal on MSB signal path 114 and the signal on signal path 132, and provides the COL_ADD signal on COL_ADD signal path 136. In response to a logic low MSB signal, XOR gate 134 passes the signal on signal path 132 to COL_ADD signal path 136. In response to a logic high MSB signal, XOR gate 134 inverts the signal on signal path 132 and passes the inverted signal to COL_ADD signal path 136.

In operation, the RESET signal on RESET signal path 106 is activated to reset the count of data valid counter 112 to zero. In one embodiment, the RESET signal is provided by memory controller 20 through communication link 22. With the count of data valid counter 112 equal to zero, data valid counter 112 outputs a logic high EN signal on EN signal path 116 to enable inverting tri-state buffer 122. Latch 118 latches the EXT_COL_ADD signal in response to the READ signal in the compression test mode. In one embodiment, the EXT_COL_ADD signal and the READ signal are provided by memory controller 20 through communication link 22. With inverting tri-state buffer 122 enabled, the EXT_COL_ADD signal in latch 118 is inverted and passed to latch 126, which again inverts the EXT_COL_ADD signal. With the count of data valid counter 112 still at zero, data valid counter 112 outputs a logic low MSB signal on MSB signal path 114. With a logic low MSB signal, the EXT_COL_ADD signal in latch 126 is passed by XOR gate 134 to provide the COL_ADD signal on signal path 136.

After the first DATA_VALID signal on DATA_VALID signal path 104 is received by data valid counter 112, the count of data valid counter 112 increments. With the count of data valid counter 112 greater than zero, data valid counter 112 outputs a logic low EN signal on EN signal path 116 to disable inverting tri-state buffer 122. With inverting tri-state buffer 122 disabled, the EXT_COL_ADD signal in latch 118 is blocked from passing to latch 126. The next READ signal on READ signal path 110 latches the next EXT_COL_ADD signal in latch 118. In one embodiment, the count of data valid counter 112 continues to increment in response to each DATA_VALID signal up until the burst length divided by four.

When the most significant bit of the count of data valid counter 112 changes from logic low to logic high, data valid counter 112 outputs a logic high MSB signal on MSB signal path 114. With a logic high MSB signal, the EXT_COL_ADD signal in latch 126 is inverted and passed by XOR gate 134 to provide the COL_ADD signal on COL_ADD signal path 136 to compensate for the topology of the array of memory cells 32. The COL_ADD signal on COL_ADD signal path 136 is used to generate the compression register of expected data in the compression test mode for comparing to the data read from the array of memory cells 32.

Figure 4:
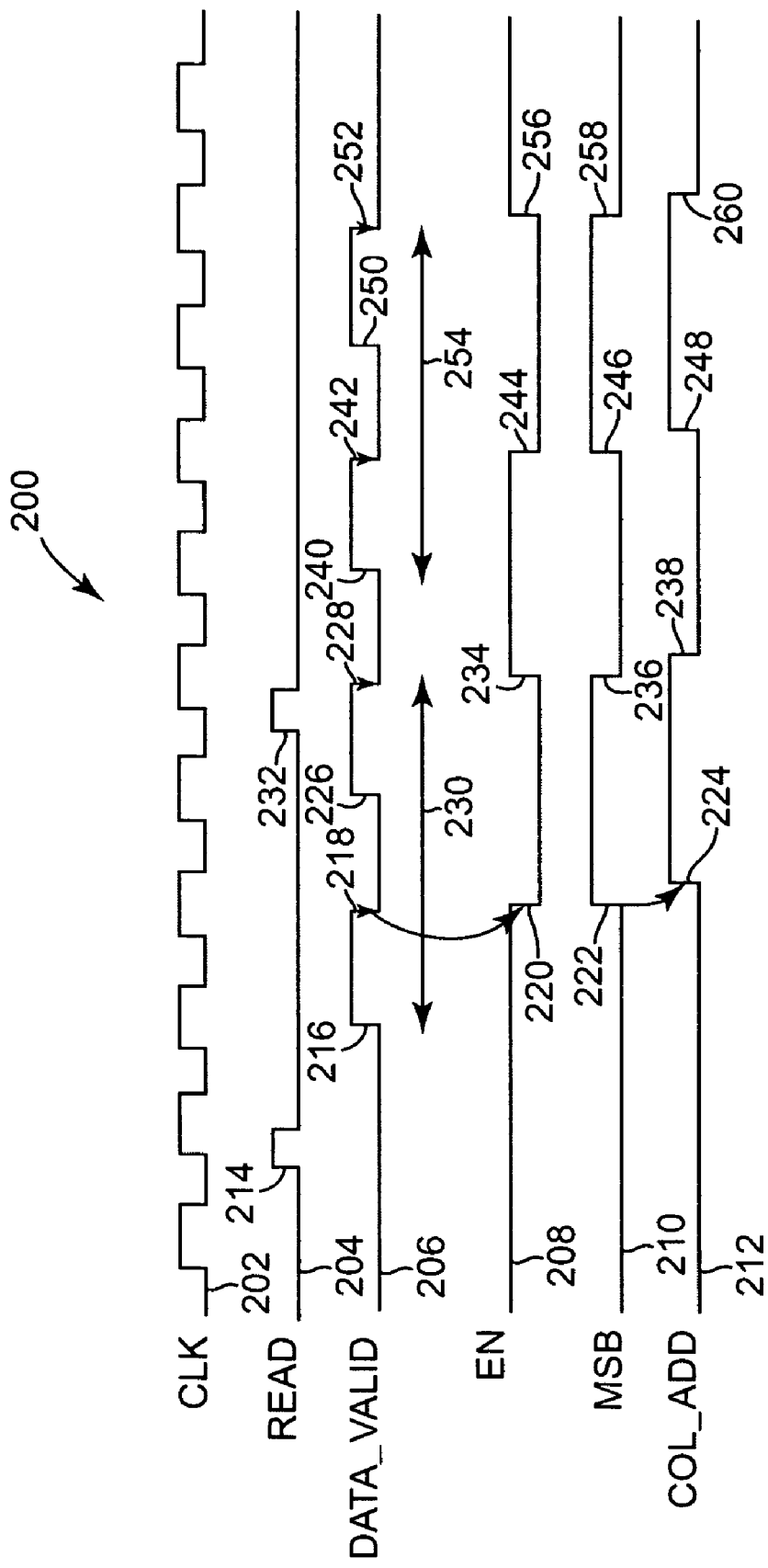
FIG. 4 is a timing diagram illustrating one embodiment of the timing of signals for the internal column counter.

FIG. 4 is a timing diagram 200 illustrating one embodiment of the timing of signals for internal column counter 100. Timing diagram 200 illustrates the timing of signals for a DDR-II SDRAM with a burst length of eight and a column address equal to zero for two read bursts. Timing diagram 200 includes clock (CLK) signal 202, READ signal 204 on READ signal path 110, DATA_VALID signal 206 on DATA_VALID signal path 104, EN signal 208 on EN signal path 116, MSB signal 210 on MSB signal path 114, and COL_ADD signal 212 on COL_ADD signal path 136.

To begin, the RESET signal on RESET signal path 106 is activated to reset the count of data valid counter 112 to zero. With the count of data valid counter 112 equal to zero, data valid counter 112 provides a logic high EN signal 208 to enable inverting tri-state buffer 122 and a logic low MSB signal 210. READ signal 204 transitions to a logic high at 214 in response to a first read command for the compression test mode. In response to rising edge 214 of READ signal 204, the EXT_COL_ADD signal on EXT_COL_ADD signal path 108 is latched by latch 118. With inverting tri-state buffer 122 enabled, the EXT_COL_ADD signal is passed from latch 118 to latch 126. With a logic low MSB signal 210, the EXT_COL_ADD signal in latch 126 is passed by XOR gate 134 to provide a logic low COL_ADD signal 212.

With the first data from the array of memory cells 32 in the data path and valid for the first read command, DATA_VALID signal 206 transitions to a logic high at 216. DATA_VALID signal 206 transitions to a logic low at 218 when the data from the array of memory cells 32 is done being processed at the data path. Falling edge 218 of DATA_VALID signal 206 increments the count of data valid counter 112. With the count of data valid counter 112 equal to one, data valid counter 112 provides falling edge 220 of EN signal 208 and rising edge 222 of MSB signal 210. With EN signal 208 logic low, inverting tri-state buffer 122 is disabled. With a logic high MSB signal 210, the EXT_COL_ADD signal in latch 126 is inverted and passed by XOR gate 134 to provide a logic high COL_ADD signal 212 at 224.

With the second data from the array of memory cells 32 in the data path and valid for the first read command, DATA_VALID signal 206 transitions to a logic high at 226. DATA_VALID signal 206 transitions to a logic low at 228 when the data from the array of memory cells 32 is done being processed at the data path. Between rising edge 226 and falling edge 228 of DATA_VALID signal 206, READ signal 204 transitions to a logic high at 232 in response to a second read command for the compression test mode. In response to rising edge 232 of READ signal 204, the EXT_COL_ADD signal on EXT_COL_ADD signal path 108 is latched by latch 118. With inverting tri-state buffer 122 disabled, the EXT_COL_ADD signal is blocked from passing from latch 118 to latch 126. The data read from the array of memory cells 32 in response to the first read command indicated by rising edge 214 of READ signal 204 is passed to the data path during the time indicated at 230. The data read from the array of memory cell 32 is compared to the expected data of the compression register based on COL_ADD signal 212.

Falling edge 228 of DATA_VALID signal 206 increments the count of data valid counter 112. With the count of data valid counter 112 equal to the burst length divided by four, the count of data valid counter 112 is reset to zero. With the count of data valid counter 112 equal to zero, data valid counter 112 provides rising edge 234 of EN signal 208 to enable inverting tri-state buffer 122 and falling edge 236 of MSB signal 210. The EXT_COL_ADD signal in latch 118 is passed to latch 126. With a logic low MSB signal 210, the EXT_COL_ADD signal in latch 126 is passed by XOR gate 134 to provide a logic low COL_ADD signal 212 at 238.

With the first data from the array of memory cells 32 in the data path and valid for the second read command, DATA_VALID signal 206 transitions to a logic high at 240. DATA_VALID signal 206 transitions to a logic low at 242 when the data from the array of memory cells 32 is done being processed at the data path. Falling edge 242 of DATA_VALID signal 206 increments the count of data valid counter 112. With the count of data valid counter 112 equal to one, data valid counter 112 provides falling edge 244 of EN signal 208 and rising edge 246 of MSB signal 210. With EN signal 208 logic low, inverting tri-state buffer 122 is disabled. With a logic high MSB signal 210, the EXT_COL_ADD signal in latch 126 is inverted and passed by XOR gate 134 to provide a logic high COL_ADD signal 212 at 248.

With the second data from the array of memory cells 32 in the data path and valid for the second read command, DATA_VALID signal 206 transitions to a logic high at 250. DATA_VALID signal 206 transitions to a logic low at 252 when the data from the array of memory cells 32 is not in the data path. The data read from the array of memory cells 32 in response to the second read command indicated by rising edge 232 of READ signal 204 is passed to the data path during the time indicated at 254. The data read from the array of memory cells 32 is compared to the expected data of the compression register based on COL_ADD signal 212.

Falling edge 252 of DATA_VALID signal 206 increments the count of data valid counter 112. With the count of data valid counter 112 equal to the burst length divided by four, the count of data valid counter 112 is reset to zero. With the count of data valid counter 112 equal to zero, data valid counter 112 provides rising edge 256 of EN signal 208 to enable inverting tri-state buffer 122 and falling edge 258 of MSB signal 210. The EXT_COL_ADD signal in latch 118 is passed to latch 126. With a logic low MSB signal 210, the EXT_COL_ADD signal in latch 126 is passed by XOR gate 134 to provide a logic low COL_ADD signal 212 at 260.

Embodiments of the present invention provide an internal column counter for a compression test mode. The internal column counter for the read sequence in the compression test mode ensures the correct column address is used to generate the compression register of expected data for comparing to the data read from the array of memory cells. In the compression test mode, the column address for the next read command is latched before the previous read command is fully executed. The column address for the next read command is passed to the data path to generate the correct compression register for the next read command once the previous read command is fully executed.

The invention claimed is:

1. A memory circuit comprising:
   a memory comprising an array of memory cells; and
   an internal column counter for a read sequence in a compression test mode of the memory, the internal column counter configured to:
   provide a first column address for generating a compression register of expected data to compare to data read from the array of memory cells in response to a first read command;
   latch a second column address in response to a second read command while the first read command is executing; and
   provide the second column address for generating the compression register of expected data to compare to data read from the array of memory cells in response to the second read command once execution of the first read command is completed.

2. The memory circuit of claim 1, wherein the internal column counter is further configured to count data valid signals to determine when execution of the first read command is completed.

3. The memory circuit of claim 1, wherein the internal column counter is further configured to provide an enable signal with a count of the internal column counter equal to zero to pass the latched second column address to provide the second column address for generating the compression register.

4. The memory circuit of claim 1, wherein the internal column counter is further configured to provide a most significant counter bit signal for inverting the first column address for a second half of a burst length for the first read command.

5. The memory circuit of claim 1, wherein the memory comprising a dynamic random access memory.

6. The memory circuit of claim 1, wherein the memory comprising a double data rate synchronous dynamic random access memory.

7. The memory circuit of claim 1, wherein the memory comprising a double data rate II synchronous dynamic random access memory.

8. An internal column counter for a random access memory, the internal column counter comprising:
a data valid counter configured to count data valid signals and provide an enable signal in response to a count equal to zero;
a first column address latch configured to latch a column address in response to a read command; and
a second column address latch configured to latch the column address passed from the first column address latch in response to the enable signal,
wherein the second column address latch provides the column address for generating a compression register of expected data to compare to data read from a memory array in a compression test mode.

9. The memory circuit of claim 8, further comprising:
a tri-state buffer configured to pass the column address from the first column address latch to the second column address latch in response to the enable signal.

10. The memory circuit of claim 8, further comprising:
an XOR gate configured to invert the column address provided by the second column address latch in response to a logic high most significant bit of the count of the data valid counter.

11. The memory circuit of claim 8, wherein the first column address latch is configured to latch the column address in response to the read command with a previous read command not fully executed.

12. The memory circuit of claim 8, wherein the data valid counter is configured to receive a burst length signal and count data valid signals up to the burst length divided by four.

13. The memory circuit of claim 8, wherein the data valid counter is configured to receive a reset signal and reset the count to zero in response to the reset signal.

14. An internal column counter for a read sequence for a compression test mode of a dynamic random access memory, the internal column counter comprising:
a data valid counter configured provide a most significant counter bit signal and an enable signal based on a count of data valid signals;
a first latch configured to latch a column address in response to a read command;
a tri-state buffer configured to be enabled in response to the enable signal;
a second latch configured to receive the column address from the first latch through the tri-state buffer with the tri-state buffer enabled; and
an XOR gate configured to receive the column address from the second latch and invert the column address in response to the most significant counter bit signal.

15. The internal column counter of claim 14, wherein the data valid counter, first latch, tri-state buffer, second latch, and XOR gate are configured to prevent a second column address for a second read command from being used to generate a compression register of expected data to compare to data read from a memory array in response to a first read command.

16. The internal column counter of claim 14, wherein the data valid counter is further configured to increment the count of data valid signals in response to falling edges of the data valid signals.

17. The internal column counter of claim 14, wherein the data valid counter is further configured to reset the count of data valid signals to zero in response to a reset signal.

18. The internal column counter of claim 14, wherein the data valid counter is further configured to reset the count of data valid signals to zero in response to a count of data valid signals equal to a burst length divided by four.

19. A dynamic random access memory comprising:
an array of memory cells; and
an internal column counter for a read sequence in a compression test mode, the internal column counter comprising:
means to provide a first column address for generating a compression register of expected data to compare to data read from the array of memory cells in response to a first read command;
means to latch a second column address in response to a second read command while the first read command is executing; and
means to provide the second column address for generating the compression register of expected data to compare to data read from the array of memory cells in response to the second read command once execution of the first read command is completed.

20. The memory of claim 19, wherein the internal column counter further comprises means to count data valid signals to determine when execution of the first read command is completed.

21. The memory of claim 19, wherein the internal column counter further comprises means to provide an enable signal with a count of the internal column counter equal to zero to pass the latched second column address to provide the second column address for generating the compression register.

22. The memory of claim 19, wherein the internal column counter further comprises means to provide a most significant counter bit signal for inverting the first column address for a second half of a burst length for the first read command.

23. A method for testing a memory in a compression test mode, the method comprising:
providing a first column address for generating a compression register of expected data to compare to data read from an array of memory cells in response to a first read command;

latching a second column address in response to a second read command while the first read command is executing; and providing the second column address for generating the compression register of expected data to compare to data read from the array of memory cells in response to the second read command once execution of the first read command is completed.

24. The method of claim 23, further comprising:

counting data valid signals to determine when execution of the first read command is completed.

25. The method of claim 23, further comprising:

providing an enable signal with a count of an internal column counter equal to zero to pass the latched second column address for providing the second column address for generating the compression register.

26. The method of claim 23, further comprising:

providing a most significant counter bit signal from an internal column counter for inverting the first column address for a second half of a burst length for the first read command.

27. A method for testing a memory in a compression test mode, the method comprising:

resetting a data valid count to zero;

providing a first enable signal in response to the data valid count of zero;

latching a first column address in a first latch in response to a first read command;

latching the first column address in a second latch in response to the first enable signal to provide the first column address for generating a compression register of expected data to compare to data read from an array of memory cells in response to the first read command;

incrementing the data valid count in response to a first data valid signal; and latching a second column address in the first latch in response to a second read command received before the first read command is fully executed.

28. The method of claim 27, further comprising:

providing a most significant data valid count signal in response to incrementing the data valid count; and inverting the first column address from the second latch in response to the most significant data valid count signal to provide an inverted first column address to compensate for the topology of the array of memory cells for generating the compression register of expected data to compare to data read from the array of memory cells in response to the first read command.

29. The method of claim 28, further comprising:

incrementing the data valid count in response to a second data valid signal; and resetting the data valid count to zero in response to incrementing the data valid count in response to the second data valid signal.

30. The method of claim 29, further comprising:

providing a second enable signal in response to the data valid count of zero;

latching the second column address in the second latch in response to the second enable signal to provide the second column address for generating the compression register of expected data to compare to data read from the array of memory cells in response to the second read command.

31. A method for testing a memory in a compression test mode, the method comprising:

resetting a data valid count to zero;

providing a first enable signal in response to the data valid count of zero;

enabling a tri-state buffer in response to the first enable signal;

latching a first column address in a first latch in response to a first read command;

latching the first column address in a second latch in response to the first column address passing through the tri-state buffer;

passing the first column address in the second latch for generating a compression register of expected data to compare to first data read from a memory array in response to the first read command;

incrementing the data valid count in response to a first data valid signal indicating the first data read from the memory array in response to the first read command is valid;

inverting and passing the first column address in the second latch for generating a compression register of expected data compensated for the topology of the memory array to compare to second data read from the memory array in response to the first read command; and latching a second column address in the first latch in response to a second read command before the first read command is fully executed.

32. The method of claim 31, further comprising:

incrementing the data valid count in response to a second data valid signal indicating the second data read from the memory array in response to the first read command is valid;

resetting the data valid count to zero in response to incrementing the data valid count in response to the second data valid signal;

providing a second enable signal in response to the data valid count of zero;

enabling the tri-state buffer in response to the second enable signal;

latching the second column address in the second latch in response to the second column address passing through the tri-state buffer; and passing the second column address in the second latch for generating the compression register of expected data to compare to third data read from the memory array in response to the second read command.

* * * * *